(12) United States Patent
Kawamura (10) Patent No.: US 10,877,104 B2
(45) Date of Patent: Dec. 29, 2020

(54) GROUND FAULT DETECTION APPARATUS

(71) Applicant: Yazaki Corporation, Tokyo (JP)

(72) Inventor: Yoshihiro Kawamura, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 76 days.

(21) Appl. No.: 16/293,914

(22) Filed: Mar. 6, 2019

(65) Prior Publication Data

US 2019/0310300 A1    Oct. 10, 2019

(30) Foreign Application Priority Data

Apr. 9, 2018  (JP) ................................. 2018-074545

(51) Int. Cl.

| | | |
|---|---|---|
| *G01R 31/50* | (2020.01) | |
| *G01R 31/382* | (2019.01) | |
| *B60L 3/00* | (2019.01) | |
| *G01R 1/20* | (2006.01) | |
| *G01R 27/02* | (2006.01) | |

(Continued)

(52) U.S. Cl.
CPC ............ *G01R 31/50* (2020.01); *B60L 3/0069* (2013.01); *G01R 1/203* (2013.01); *G01R 27/025* (2013.01); *G01R 31/086* (2013.01); *G01R 31/382* (2019.01); *H03K 17/6871* (2013.01); *G01R 31/1272* (2013.01)

(58) Field of Classification Search
CPC ...... G01R 31/50; G01R 31/382; G01R 31/52; G01R 31/025; G01R 31/203; G01R 27/025

See application file for complete search history.

(56) References Cited

U.S. PATENT DOCUMENTS

| | | | |
|---|---|---|---|
| 2009/0289640 A1 | 11/2009 | Kawamura et al. | |
| 2010/0156426 A1* | 6/2010 | Kang ................... | B60L 3/0069 |
| | | | 324/444 |

(Continued)

FOREIGN PATENT DOCUMENTS

JP    2009-281986 A    12/2009

*Primary Examiner* — Dominic E Hawkins
(74) *Attorney, Agent, or Firm* — Sughrue Mion, PLLC (57) ABSTRACT

A ground fault detection apparatus includes a control unit, a detection capacitor, a positive-electrode-side first resistor connected to positive-electrode side of a high-voltage battery, a negative-electrode-side first resistor connected to negative-electrode side of the high-voltage battery, a positive-electrode-side second resistor where one end is grounded and voltage of another end is measured by the control unit, a negative-electrode-side second resistor having one end grounded, a positive-electrode-side C contact switch that switches connection destination of one end of the detection capacitor between a path including the positive-electrode-side first resistor and a path including the positive-electrode-side second resistor based on instruction from the control unit, a negative-electrode-side C contact switch that switches connection destination of another end of the detection capacitor between a path including the negative-electrode-side first resistor and a path including the negative-electrode-side second resistor based on instruction from the control unit, and a path switching C contact switch.

1 Claim, 12 Drawing Sheets

(51) Int. Cl.
  *G01R 31/08*     (2020.01)
  *H03K 17/687*    (2006.01)
  *G01R 31/12*     (2020.01)

(56) References Cited

U.S. PATENT DOCUMENTS

2010/0207635 A1*  8/2010  Plagens ................. B60L 3/0069
                                                324/509
2011/0006781 A1*  1/2011  Kawamura ............ G01R 31/52
                                                324/551
2015/0293167 A1*  10/2015 Kawamura ........... B60L 3/0069
                                                324/551

* cited by examiner

GROUND FAULT DETECTION APPARATUS

BACKGROUND

Technical Field

The present invention relates to a ground fault detection apparatus using a flying capacitor.

Related Art

In vehicles such as a hybrid vehicle having an engine and an electric motor as a driving source and an electric vehicle, a battery mounted on a vehicle body is charged and a propulsive force is generated by using electric energy supplied from the battery. Generally, a battery-related power supply circuit is configured as a high-voltage circuit that handles a high voltage of 200 V or higher, and in order to ensure safety, the high-voltage circuit including the battery has a non-grounded configuration in which the high-voltage circuit is electrically insulated from the vehicle body that is a ground reference potential point.

In a vehicle equipped with a non-grounded high-voltage battery, a ground fault detection apparatus is provided in order to monitor an insulation state (ground fault) between the vehicle body and a system provided with the high-voltage battery, more specifically, a main power supply system extending from the high-voltage battery to a motor. In the ground fault detection apparatus, a system using a capacitor called a flying capacitor is widely used.

Figure 9:
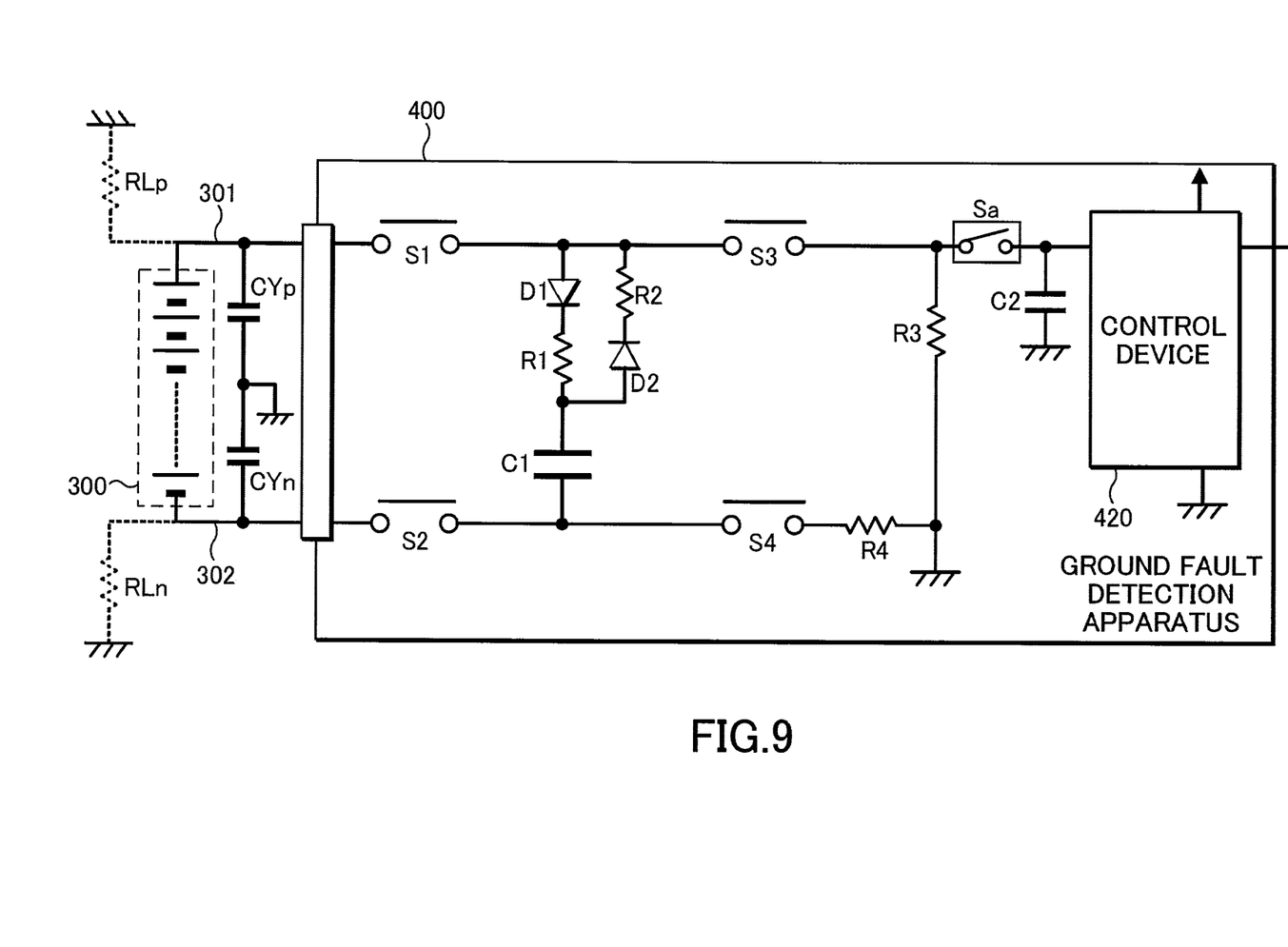
FIG. 9 is a diagram illustrating a circuit example of a flying capacitor type ground fault detection apparatus in the related art.

FIG. 9 is a diagram illustrating an example of a circuit of a flying capacitor type ground fault detection apparatus in the related art. As shown, a ground fault detection apparatus 400 is a device connected to a non-grounded high-voltage battery 300 to detect a ground fault of a system provided with the high-voltage battery 300. Here, an insulation resistor between a positive-electrode side of the high-voltage battery 300 and a ground is represented as RLp, and an insulation resistor between a negative-electrode side of the high-voltage battery 300 and the ground is represented as RLn.

As shown, the ground fault detection apparatus 400 includes a detection capacitor C1 operating as a flying capacitor. Further, in order to switch a measurement path and to control charging and discharging of the detection capacitor C1, four switching elements S1 to S4 are provided around the detection capacitor C1. Further, a switching element Sa for sampling a measurement voltage corresponding to the charging voltage of the detection capacitor C1 is provided.

In the ground fault detection apparatus 400, in order to grasp insulation resistances RLp and RLn, a measurement operation is repeated with V0 measurement period→Vc1n measurement period→V0 measurement period→Vc1p measurement period as one cycle. In all of the measurement periods, the charging voltage of the detection capacitor C1 is measured after charging the detection capacitor C1 with a voltage to be measured. Then, for the subsequent measurement, the detection capacitor C1 is discharged.

Figure 10A:
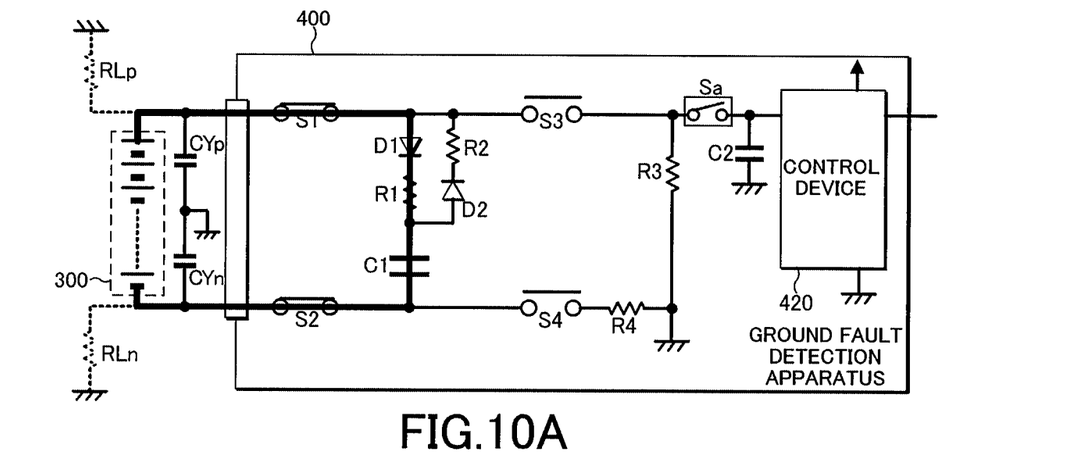
FIGS. 10A to 10C are diagrams illustrating a measurement path in a V0 measurement period.

In the V0 measurement period, a voltage corresponding to the voltage of the high-voltage battery 300 is measured. Therefore, the switching elements S1 and S2 are turned on and the switching elements S3 and S4 are turned off, whereby the detection capacitor C1 is charged. That is, as illustrated in FIG. 10A, the high-voltage battery 300, a resistor R1, and the detection capacitor C1 serve as a measurement path.

Figure 10B:
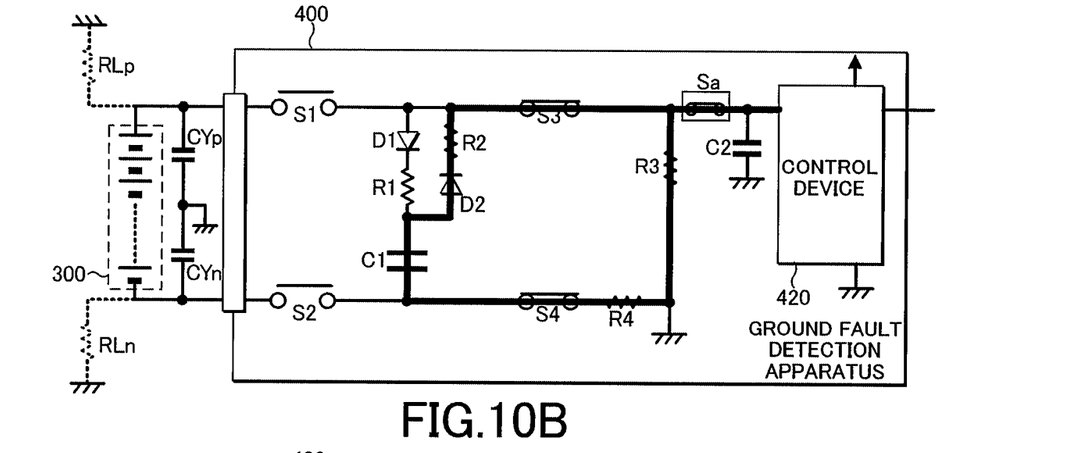
Figure 10C:
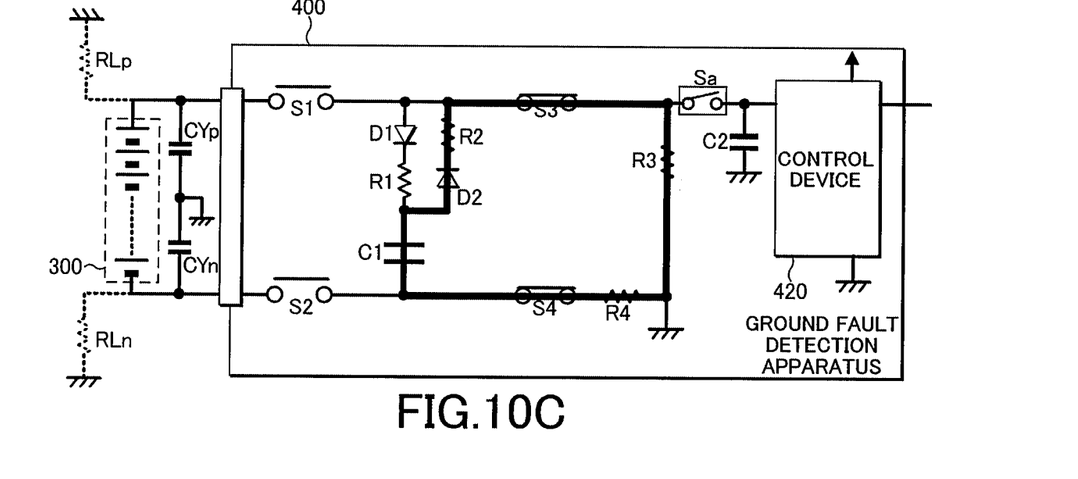

At the time of measuring the charging voltage of the detection capacitor C1, as illustrated in FIG. 10B, the switching elements S1 and S2 are turned off, the switching elements S3 and S4 are turned on, and the switching element Sa is turned on, whereby sampling is performed with a control device 420. Thereafter, as illustrated in FIG. 10C, the switching element Sa is turned off, and the detection capacitor C1 is discharged for the subsequent measurement. At the time of measuring the charge voltage of the detection capacitor C1, the operation at the time of discharging the detection capacitor C1 is the same in other measurement periods.

Figure 11A:
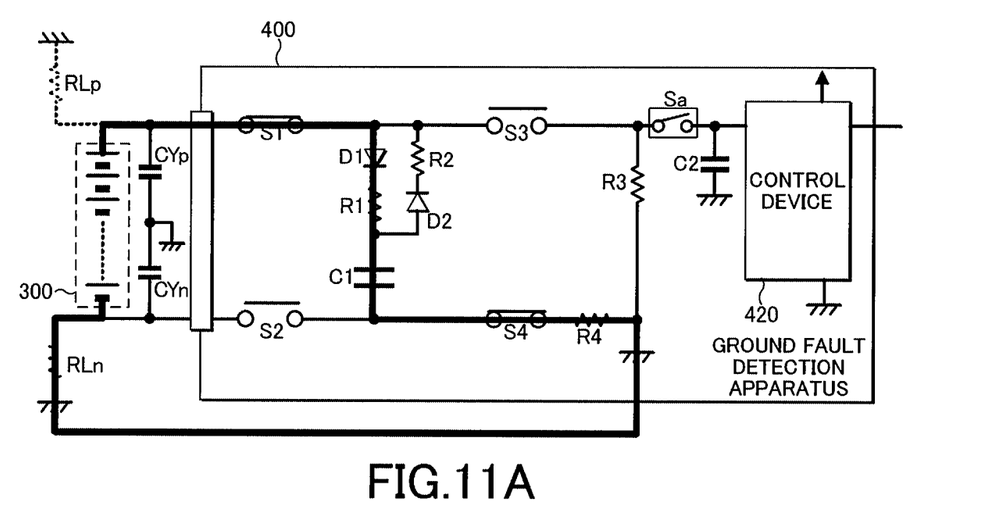
FIGS. 11A and 11B are diagrams illustrating measurement paths in a Vc1$n$ measurement period and a Vc1$p$ measurement period.

In the Vc1n measurement period, a voltage reflecting an influence of the insulation resistance RLn is measured. Therefore, the switching elements S1 and S4 are turned on and the switching elements S2 and S3 are turned off, whereby the detection capacitor C1 is charged. That is, as illustrated in FIG. 11A, the high-voltage battery 300, the resistor R1, the detection capacitor C1, a resistor R4, the ground, and the insulation resistor RLn serve as a measurement path.

Figure 11B:
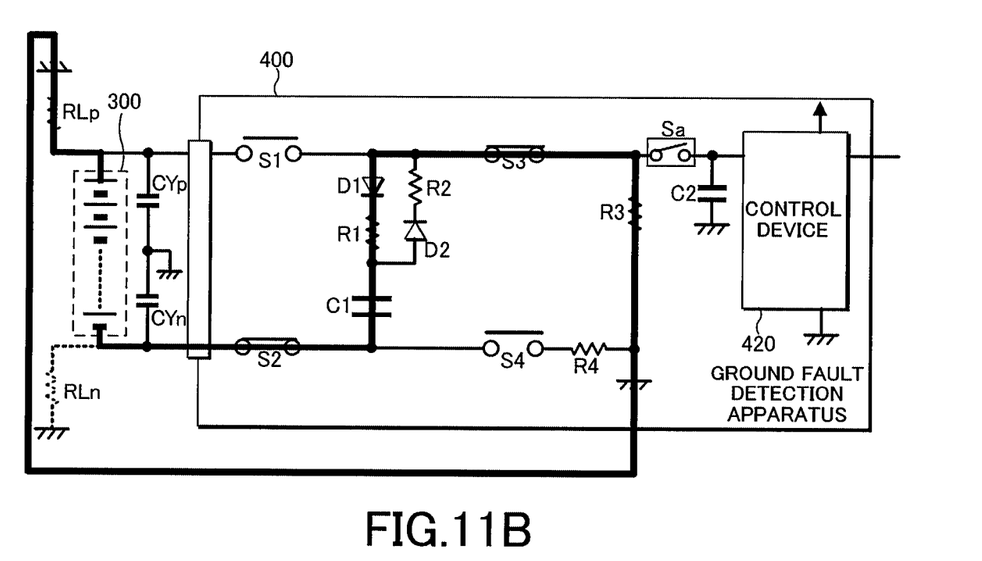

In the Vc1p measurement period, a voltage, reflecting the influence of the insulation resistor RLp is measured. Therefore, the switching elements S2 and S3 are turned on and the switching elements S1 and S4 are turned off, whereby the detection capacitor C1 is charged. That is, as illustrated in FIG. 11B, the high-voltage battery 300, the insulation resistor RLp, the ground, the resistor R3, the resistor R1, and the detection capacitor C1 serve as a measurement path.

It is known that $(RLp \times RLn)/(RLp + RLn)$ can be obtained based on $(Vc1p + Vc1n)/V0$ calculated from V0, Vc1n and Vc1p obtained in these measurement periods. Therefore, the control device 420 in the ground fault detection apparatus 400 can grasp the insulation resistances RLp and RLn by measuring V0, Vc1n and Vc1p. Then, when the insulation resistances RLp and RLn become equal to or lower than a predetermined determination reference level, it is determined that a ground fault has occurred, and an alarm is outputted.

Figure 12:
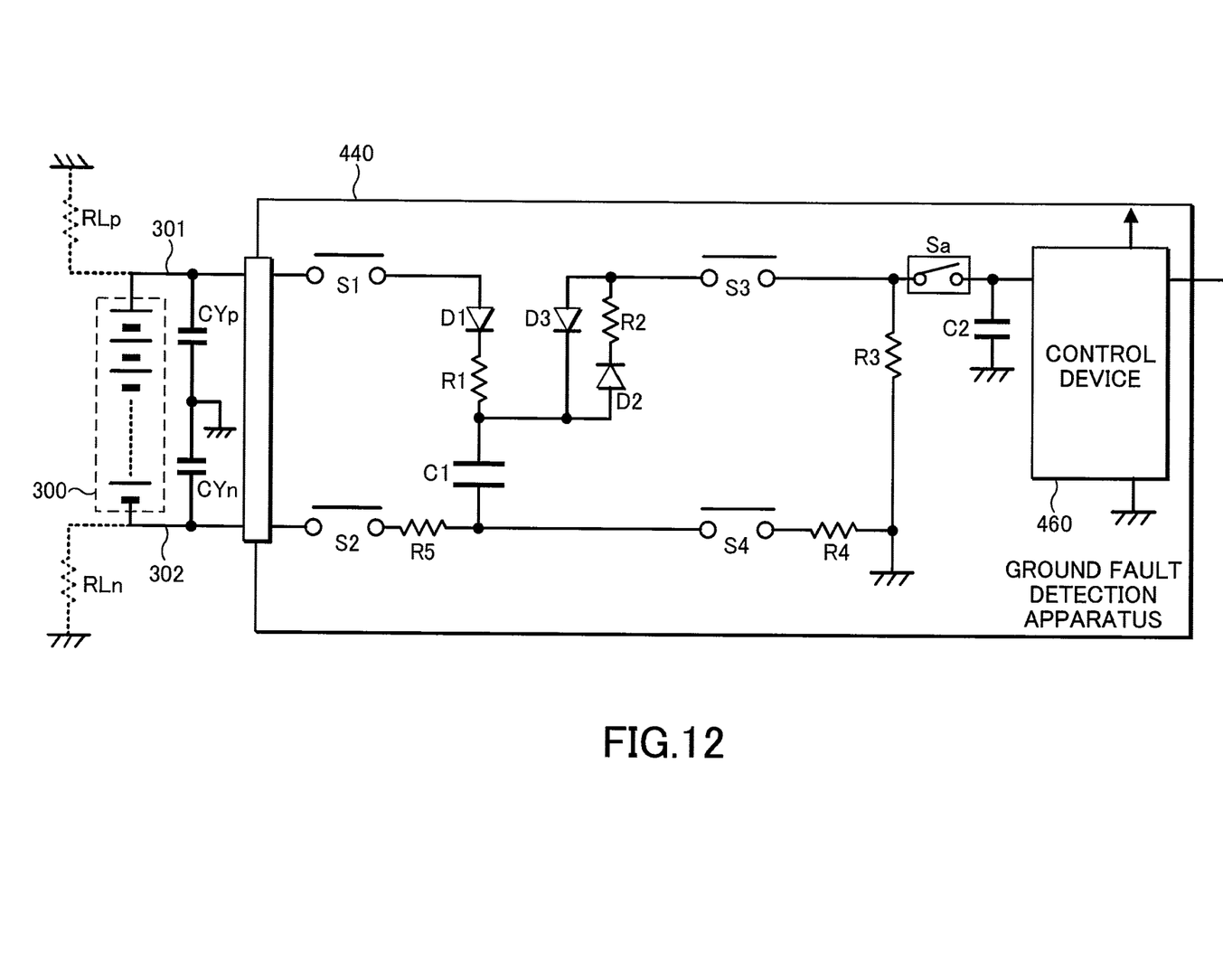
FIG. 12 is a diagram illustrating another example of a circuit of a flying capacitor type ground fault detection apparatus is the related art.

Further, in JP 2009-281986 A, a ground fault detection apparatus 440 having a circuit configuration as illustrated in FIG. 12 has been proposed. Also in the ground fault detection apparatus 440, a switching change-over state in each measurement period is the same as that of the ground fault detection apparatus 400.

Patent Literature 1: JP 2009-281986 A

SUMMARY

In the related art, a ground fault detection apparatus is configured by using four optical MOS-FETs which are insulating type switching elements as switching elements S1 to S4. However, the optical MOS-FET is expensive, which causes an increase in cost of the ground fault detection apparatus.

Accordingly, an object of the present invention is to provide to a ground fault detection apparatus using a flying capacitor in which an increase in cost due to a switching element is suppressed.

In order to solve the aforementioned problem, a ground fault detection apparatus according to a first aspect of the present invention provides a ground fault detector apparatus that is connected to a non-grounded high-voltage battery and detects a ground fault of a system provided with the high-voltage battery, the ground fault detection apparatus including: a control unit; a detection capacitor that operates as a flying capacitor; a positive-electrode-side first resistor connected to a positive-electrode side of the high-voltage battery; a negative-electrode-side first resistor connected to a negative-electrode side of the high-voltage battery; a positive-electrode-side second resistor having a first end grounded and a second end, a voltage of the second end being measured by the control unit; a negative-electrode-side second resistor having a first end grounded; a positive-electrode-side C contact switch that is formed as a twin relay having relays operating in conjunction with each other and connected in parallel, and that is configured to alternatively switch a connection destination of a first end of the detection capacitor between a path including the positive-electrode-side first resistor and a path including the positive-electrode-side second resistor based on an instruction from the control unit; a negative-electrode-side C contact switch that is formed as a twin relay having relays operating in conjunction with each other and connected in parallel, and that is configured to alternatively switch a connection destination of a second end of the detection capacitor between a path including the negative-electrode-side first resistor and a path including the negative-electrode-side second resistor based on an instruction from the control unit; and a path switching C contact switch formed as a twin relay having relays configured to operate in conjunction with each other, one of the relays of the path switching C contact switch being configured to switch one of the relays of the positive-electrode-side C contact switch to the connection destination of the first end of the detection capacitor, and another one of the relays of the path switching C contact switch being configured to switch one of the relays of the negative-electrode-side C contact switch to a connection destination of the second end of the detection capacitor.

In order to solve the aforementioned problem, a ground fault detection apparatus according to a second aspect of the present invention provides a ground fault detection apparatus that is connected to a non-grounded high-voltage battery and detects a ground fault of a system provided with the high-voltage battery, the ground fault detection apparatus including: a control unit; a detection capacitor that operates as a flying capacitor; a positive-electrode-side first resistor connected to a positive-electrode side of the high-voltage battery; a negative-electrode-side first resistor connected to a negative-electrode side of the high-voltage battery; a positive-electrode-side second resistor having a first end grounded and a second end, a voltage of the second end being measured by the control unit; a negative-electrode-side second resistor having a first end grounded; a positive-electrode-side C contact switch that is formed as a twin relay having relays operating in conjunction with each other and connected in parallel, and that is configured to alternatively switch a connection destination of a first end of the detection capacitor between a path including the positive-electrode-side first resistor and a path including the positive-electrode-side second resistor based on an instruction from the control unit; a negative-electrode-side C contact switch that is formed as a twin relay having relays operating in conjunction with each other and connected in parallel, and that is configured to alternatively switch a connection destination of a second end of the detection capacitor between a path including the negative-electrode-side first resistor and a path including the negative-electrode-side second resistor based on an instruction from the control unit; a first shunt resistor connected to a connection side with the detection capacitor of one of the relays of the positive-electrode-side C contact switch; a first thermistor connected to a connection side with the detection capacitor of another one of the relays of the positive-electrode-side C contact switch; a second shunt resistor connected to a connection side with the detection capacitor of one of the relays of the negative-electrode-side C contact switch; and a second thermistor connected to a connection side with the detection capacitor of another one of the relays of the negative-electrode-side C contact switch.

Here, at a predetermined standard temperature, the first thermistor may have the same resistance value as that of the first shunt resistor, and the second thermistor may have the same resistance value as that of the second shunt resistor.

In order to solve the aforementioned problem, a ground fault detection apparatus according to a third aspect of the present invention provides a ground fault detection apparatus that is connected to a non-grounded high-voltage battery and detects a ground fault of a system provided with the high-voltage battery, the ground fault detection apparatus including: a control unit; a detection capacitor that operates as a flying capacitor; a positive-electrode-side first resistor connected to a positive-electrode side of the high-voltage battery; a negative-electrode-side first resistor connected to a negative-electrode side of the high-voltage battery; a positive-electrode-side second resistor having a first end grounded and a second end, a voltage of the second end being measured by the control unit; a negative-electrode-side second resistor having a first end grounded; a positive-electrode-side C contact switch that alternatively switches a connection destination of a first end of the detection capacitor between a path including the positive-electrode-side first resistor and a path including the positive-electrode-side second resistor based on an instruction from the control unit; a negative-electrode-side C contact switch that alternatively switches a connection destination of a second end of the detection capacitor between a path including the negative-electrode-side first resistor and a path including the negative-electrode-side second resistor based on an instruction from the control unit; a diode and a charge resistor connected in series between the positive-electrode-side C contact switch and the first end of the detection capacitor; and a discharge resistor connected via a connection switch in parallel with the diode and the charge resistor.

According to the present invention, in the ground fault detection apparatus using a flying capacitor, an optical MOS-FET which causes an increase in cost is not used, thus an increase in cost due to the switching element can be suppressed.

DETAILED DESCRIPTION

Figure 1:
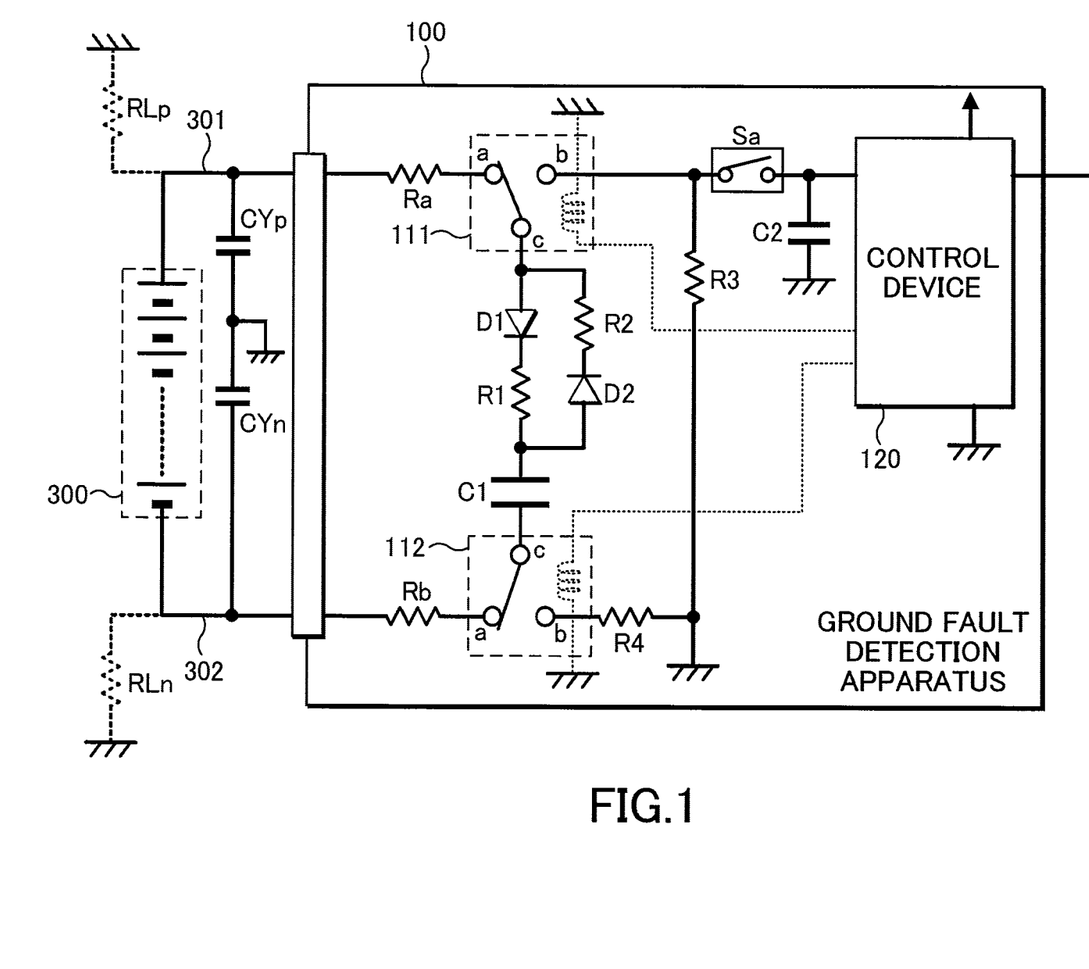
FIG. 1 is a block diagram illustrating a configuration of a ground fault detection apparatus according to an embodiment of the present invention.

Embodiments of the present invention will be described in detail with reference to the drawings. FIG. 1 is a block diagram illustrating a configuration of a ground fault detection apparatus 100 according to an embodiment of the present invention. As shown, the ground fault detection apparatus 100 is a flying capacitor type apparatus which is connected to a non-grounded high-voltage battery 300 and detects a ground fault of a system provided with the high-voltage battery 300. Herein, an insulation resistor between a positive-electrode side of the high-voltage battery. 300 and a ground is represented as RLp, and an insulation resistor between a negative-electrode side of the high-voltage battery 300 and the ground is represented as RLn. High voltage means a voltage higher than a low-voltage battery (generally 12 V) for driving various devices (lamps, wipers, etc.) in a vehicle, and the high-voltage battery 300 is a battery used for driving of a vehicle travelling.

The high-voltage battery 300 is constituted of a rechargeable battery such as a lithium ion battery, discharges via a high-voltage bus bar (not illustrated), and drives an electric motor connected via an inverter or the like. Further, during regeneration or charging equipment connection, charging is performed via the high-voltage bus bar.

In order to remove a high-frequency noise of a power supply or stabilize an operation, capacitors CYp and CYn called as an Y capacitor (a line bypass capacitor) are respectively connected between a positive-electrode-side power supply line 301 of the high-voltage battery 300 and a ground electrode and between a negative-electrode-side power supply line 302 and the ground electrode. However, the Y capacitor may be omitted.

As shown, the ground fault detection apparatus 100 includes a detection capacitor C1 operating as a flying capacitor and a switching element Sa for sampling a measurement voltage corresponding to a charging voltage of the detection capacitor C1. However, it is also possible to omit the switching element Sa. In addition, a control device 120 constituted of a microcomputer or the like is provided. The control device 120 executes a program incorporated in advance to execute various controls, such as a switch switching processing to be described below, required for the ground fault detection apparatus 100.

As described with reference to FIGS. 10A to 11B, in the measurement path in each measurement period, a switching element S1 and a switching element S3 of a system of the positive-electrode-side power supply line 301 are not simultaneously turned on, and a switching element S2 and a switching element S4 of a system of the negative-electrode-side power supply line 302 are not simultaneously turned on. That is, the switching element S1 and the switching element S3 are exclusively switched, and the switching element S2 and the switching element S4 are exclusively switched.

Therefore, in the ground fault detection apparatus 100, a positive-electrode-side C contact switch 111 is used as the switching element of the system of the positive-electrode-side power supply line 301, and the negative-electrode-side C contact switch 112 is used as the switching element of the system of the negative-electrode-side power supply line 302. The positive-electrode-side C contact switch 111 and the negative-electrode-side C contact switch 112 can be constituted of, for example, a high-withstand-voltage-small-signal mechanical relay or a reed relay.

The positive-electrode-side C contact switch 111 and the negative-electrode-side C contact switch 112 are each provided with a common contact c on the side of the detection capacitor C1. Specifically, the common contact c of the positive-electrode-side C contact switch 111 is connected to the detection capacitor C1 via a parallel circuit of a path of a diode D1 and a resistor R1 and a path of a resistor R2 and a diode D2, and the common contact c of the negative-electrode-side C contact switch 112 is connected to the other end of the detection capacitor C1. The diode D1 serving as a path during charging is connected in a direction in which the direction from the positive-electrode-side C contact switch 111 to the detection capacitor C1 is a forward direction, and the diode D2 serving as a path during discharging is connected in a reverse direction. The resistor R2 functions as a discharge resistor.

A contact a of the positive-electrode-side C contact switch 111 is connected to the positive-electrode-side power supply line 301 via the resistor Ra, and a contact a of the negative-electrode-side C contact switch 112 is connected to the positive-electrode-side power supply line 301 via a resistor Rb. That is, each of the C contact switches has the contact a on the side of the high-voltage battery 300.

A contact b of the positive-electrode-side C contact switch 111 is connected to the switching element Sa and connected to the resistor R3 having the other end grounded. The contact b of the negative electrode-side C contact switch 112 is connected to the resistor R4 having the other end grounded. That is, each of the C contact switches has the contact b on the side of the control device 120 (ground).

As illustrated in FIG. 1, the positive-electrode-side C contact switch 111 and the negative-electrode-side C contact switch 112 are independently controlled and switched by the control device 120. The control device 120 switches the measurement path by controlling switching of the positive-electrode-side C contact switch 111, the negative-electrode-side C contact switch 112, and the switching element Sa independently, and performs charging and discharging of the detection capacitor C1 and measuring a charging voltage.

Specifically, in the V0 measurement period, both the positive-electrode-side C contact switch 111 and the negative-electrode-side C contact switch 112 are switched to the contact a, thus forming a measurement path of the high-voltage battery 300, the resistor Ra, the resistor R1, the detection capacitor C1, and the resistor Rb.

At the time of measuring the charging voltage of the detection capacitor C1, both the positive-electrode-side C contact switch 111 and the negative-electrode-side C contact switch 112 are switched to the contact b to turn on the switching element Sa. Thereafter, the switching element Sa is turned off to discharge the detection capacitor C1 by mainly using the resistor R2 for the subsequent measurement. At the time of measuring the charge voltage of the detection capacitor C1, the operation at the time of discharging is the same in other measurement periods.

In the Vc1$n$ measurement period, the positive-electrode-side C contact switch 111 is switched to the contact a, and the negative-electrode-side C contact switch 112 is switched to the contact b, thus forming a measurement path of the high-voltage battery 300, the resistor Ra, the resistor R1, the detection capacitor C1, the resistor R4, the ground, and the insulation resistor RLn.

In the Vc1p measurement period, the positive electrode-side C contact switch 111 is switched to the contact b, and the negative-electrode-side C contact, switch 112 is switched to the contact a, thus forming a measurement path of the high-voltage battery 300, the insulation resistor RLp, the ground, the resistor R3, the resistor R1, the detection capacitor C1 and a resistor Rb.

In the ground fault detection apparatus 100, the resistor Ra, the resistor Rb, and the resistor R1 have high resistances of about several hundred kΩ, for example, and the resistor R2, the resistor R3, and the resistor R4 have low resistances of about several kΩ, for example.

Separately from the resistor R1, the resistor Ra is disposed on the positive-electrode side and the resistor Rb is disposed on the negative-electrode side, and the positive-electrode-side C contact switch 111 and the negative-electrode-side C contact switch 112 are constituted of the C contact relay. Thus, even if sticking occurs in either of the C contact switches, either the resistor Ra or the resistor Rb having high resistance is interposed between the high-voltage battery 300 and the control device 120, thereby limiting current. Therefore, the control device 120 and an energizing circuit can be protected.

Further, even if the contact a and the contact b are short-circuited by one of the C contact switches, either the resistor Ra or the resistor Rb having high resistance is interposed between the high-voltage battery 300 and the control device 120 to limit current, thereby protecting the control device 120.

Further, assuming that a reference value for determining the ground fault with respect to the insulation resistance RLp and the insulation resistance RLn is RLs, when the insulation resistance RLp and the insulation resistance RLn are the reference value RLs, each resistance value is determined in accordance with a relationship of R1+Ra+Rb=R1+R4+Ra+RLn=R1+R3+Rb+RLp so that the resistance value on the path is the same in the V0 measurement period, the Vc1n measurement period and the Vc1p measurement period, whereby it is possible to prevent a ground fault detection accuracy from decreasing due to an influence of DC bias characteristic even when a ceramic capacitor is used as the detection capacitor C1.

It can be determined appropriately which of the contact a on the side of the high-voltage battery 300 and the contact b on the side of the control device 120 (the ground) is set to a normal closing in the positive-electrode-side C contact switch 111 and the negative-electrode-side C contact switch 112, considering the following characteristics:

1) When the contact a on the side of the high-voltage battery 300 is set to the normal closing for both the positive-electrode-side C contact switch 111 and the negative-electrode-side C contact switch 112, the high-voltage voltage is already charged to the detection capacitor C1 at the start of startup of the ground fault detection apparatus 100, thus omitting the charging process in the first V0 measurement period. For this reason, it is possible to respond to a functional need of quickening a ground fault determination compared to a normal time in order to ensure safety at the startup;

2) When the contact b on the side of the control device 120 (ground) is set to the normal closing for both the positive-electrode-side C contact switch 111 and the negative-electrode-side C contact switch 112, the detection capacitor C1 is in the discharged state when the operation is stopped. For this reason, risk of electric shock is reduced, for example, when the ground fault detection apparatus 100 is removed; and 3) When the contact a of any one of the positive-electrode-side C contact switch 111 and the negative-electrode-side C contact switch 112 is set to the normal closing, the detection capacitor C1 is charged with a voltage between any one of electrodes and the ground at the time of the startup. By measuring the voltage and comparing it with that of the normal state, it is possible to quickly grasp a situation in which the insulation resistance of one of the electrodes is reduced in a simple manner.

As described above, since the ground fault detection apparatus 100 according to the present embodiment does not use an optical MOS-FET that causes a cost increase as a change-over switch of the measurement path for the ground fault detection, an increase in cost due to the switching element can be suppressed.

In addition, since the four switching elements of the related art are replaced by the two C contact switches, the number of components as well as control lines can be reduced as compared with the related art. Further, since it is easy to miniaturize the C contact switch, space saving is also possible.

Figure 2:
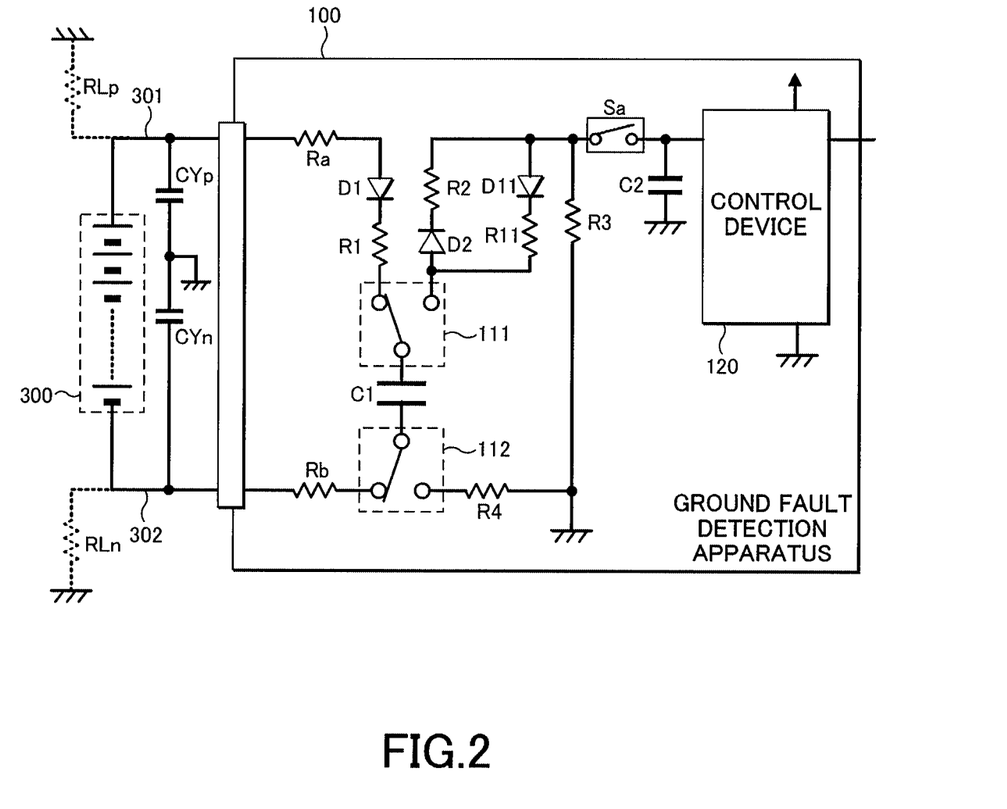
FIG. 2 is a diagram illustrating another example of an arrangement place of a positive-electrode-side C contact, switch.

In the aforementioned embodiments, the common contact c of the positive-electrode-side C contact switch 111 is connected to the detection capacitor C1 via the parallel circuit of the path of the diode D1 and the resistor R1 and the path of the resistor R2 and the diode D2, but, as illustrated in FIG. 2, the common contact c of the positive-electrode-side C contact switch 111 may be directly connected to the detection capacitor C1. In this case, it is sufficient that the contact a is connected to the resistor Ra via the diode D1 and the resistor R1, the contact b is connected to the switching element Sa via the diode D2 and the resistor R2, and the path of the diode D2 and the path of the diode D11 whose direction is opposite to that of the diode D2 and the resistor R11 are connected in parallel to each other.

Meanwhile, since the C contact switch has a mechanical contact configuration, there is a limit in the number of times of opening and closing for durability. In particular, the larger an energizing current or an applied voltage is, the greater an influence on the number of times of opening and closing for durability is. Therefore, in order to increase the number of times of opening and closing for durability, control as exemplified below may be performed or a configuration exemplified below may be adopted.

First Example

In a case where the C contact switch is switched, when the positive-electrode-side C contact switch 111 and the negative-electrode-side C contact switch 112 are switched and controlled at the same time, a variation in contact operation speed or the like may cause a bias in an actual switching-order.

In this case, loads of current, and voltage are concentrated on the C contact switch that is switched later, which affects the number of times of opening and closing for durability. In particular, it is remarkable in the switching timing to the V0 measurement period for measuring the voltage of the high-voltage battery 300.

In view of this, the control device 120 intentionally controls the switching timing of the C contact switch such that the number of being switched ahead or later for the positive-electrode-side C contact switch 111 and the negative-electrode-side C contact switch 112 is equalized, thereby avoiding the concentration of the loads on one C contact switch.

For example, in a cycle of V0 measurement period→Vc1n measurement period→V0 measurement period→Vc1p measurement period, the positive-electrode-side C contact switch 111 is switched ahead by 1 ms in the first V0 measurement period, and, the negative-electrode-side C contact switch 112 is switched ahead by 1 ms in the second V0 measurement period. As a result, since the loads of the C contact switches are equalized, it is possible to prevent an adverse influence on the durable number of times of opening and closing due to concentration of the load on one C contact switch. Of course, a method of equalizing the numbers of switching times before and after the switching timing is not limited to the aforementioned method, and various methods such as changing the C contact switch that is switched ahead, for example, at a predetermined number of times or on a predetermined time unit basis may be used.

Second Example

Figure 3:
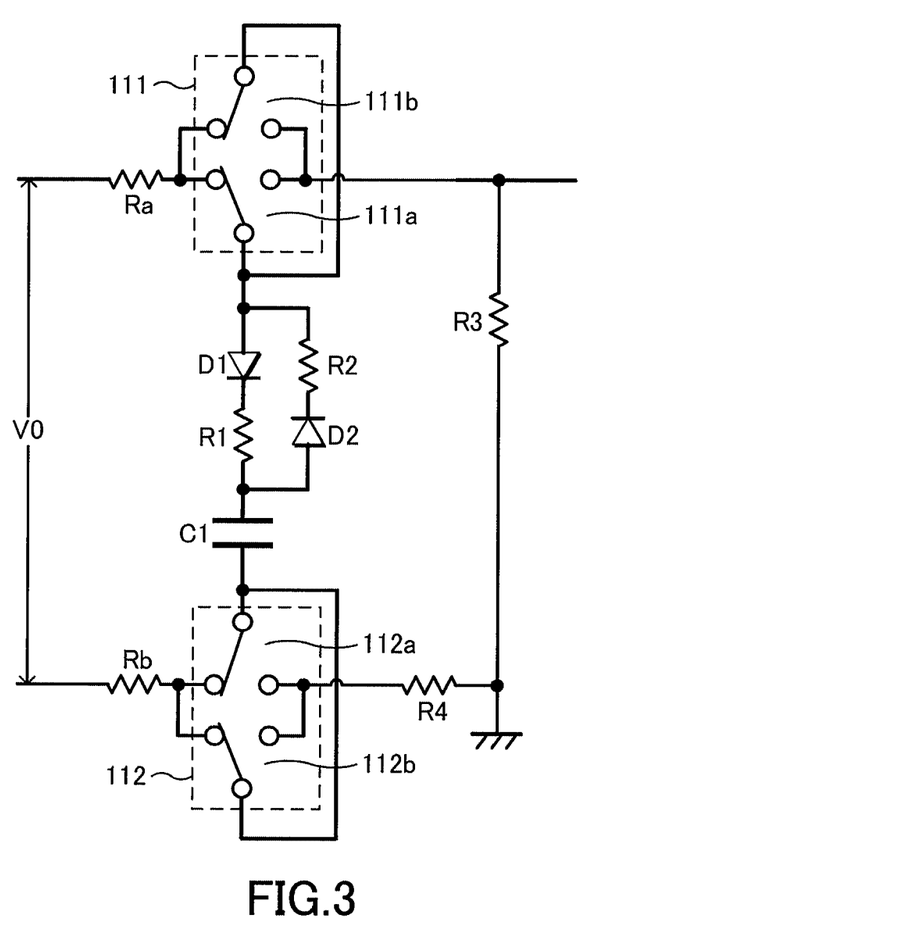
FIG. 3 is a diagram illustrating a circuit of a second example in which a twin relay is used for a C contact switch.

As illustrated in FIG. 3, the positive-electrode-side C contact switch 111 is constituted by a twin relay (111a and 111b) simultaneously switched by one control and the negative-electrode-side C contact switch 112 is constituted by a twin relay (112a and 112b) simultaneously switched by one control, and a path for current branching is provided in parallel to each relay of the twin relay. As a result, since an energizing current of each C contact switch is shunted, the current load of the C contact switch can be reduced. For the twin relay, for example, a relay of one coil 2C contact can be used.

Third Example

In the case of the second example, since a shunt ratio of the twin relay connected in parallel is based on minute contact resistances of the relays constituting the twin relay, the load may be biased to one relay, due to individual variation or the like.

Figure 4:
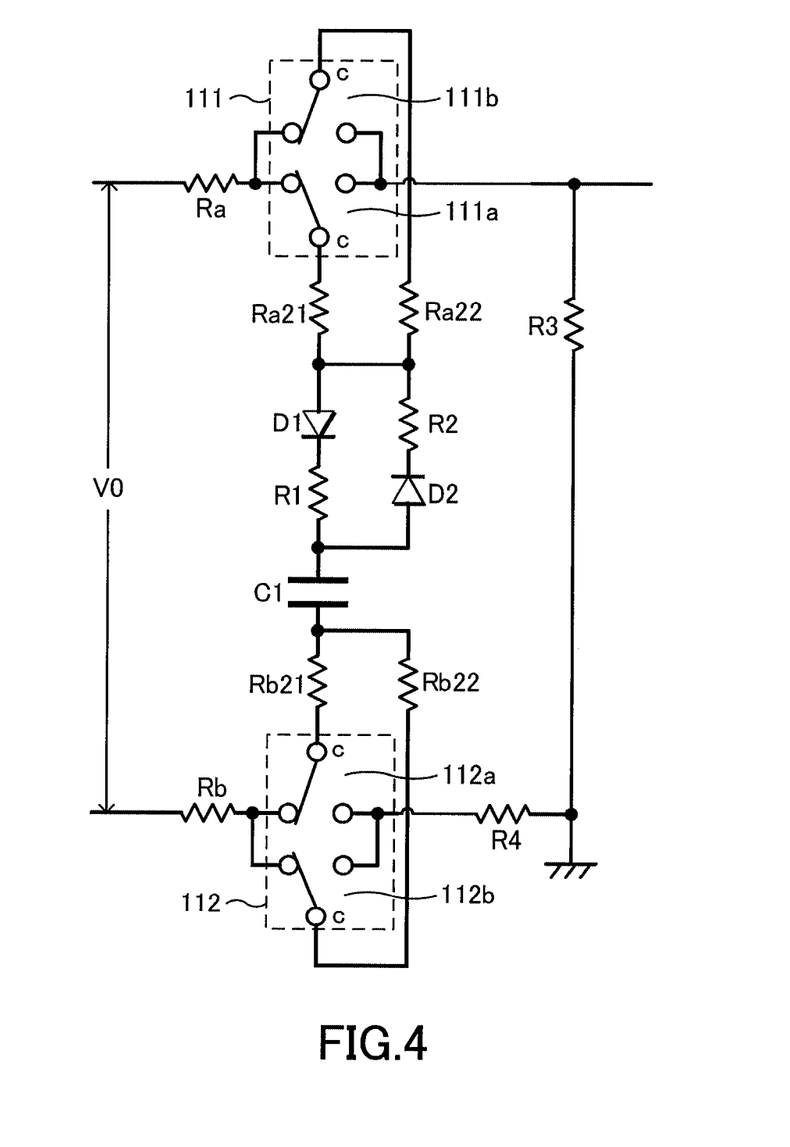
FIG. 4 is a diagram illustrating a circuit of a third example in which a twin relay is used for a C contact switch.

Therefore, as illustrated in FIG. 4, a small shunt resistor may be connected to a common contact c side path of each relay. In this case, since the shunt ratio is substantially based on the shunt resistor, it is possible to prevent bias of the load to one relay constituting the twin relay by equalizing shunt resistance values.

In the example of this figure, a shunt resistor Ra21 (<<R1) is connected to a path of the relay 111a constituting the positive-electrode-side C contact switch 111 and a shunt resistor Ra22 (=Ra21) is connected to a path of the relay 111b. Further, a shunt resistor Rb21 (<<R1) is connected to a path of the relay 112a constituting the negative-electrode-side C contact switch 112, and a shunt resistor Rb22 (=Rb21) is connected to a path of the relay 112b.

Fourth Example

Figure 5:
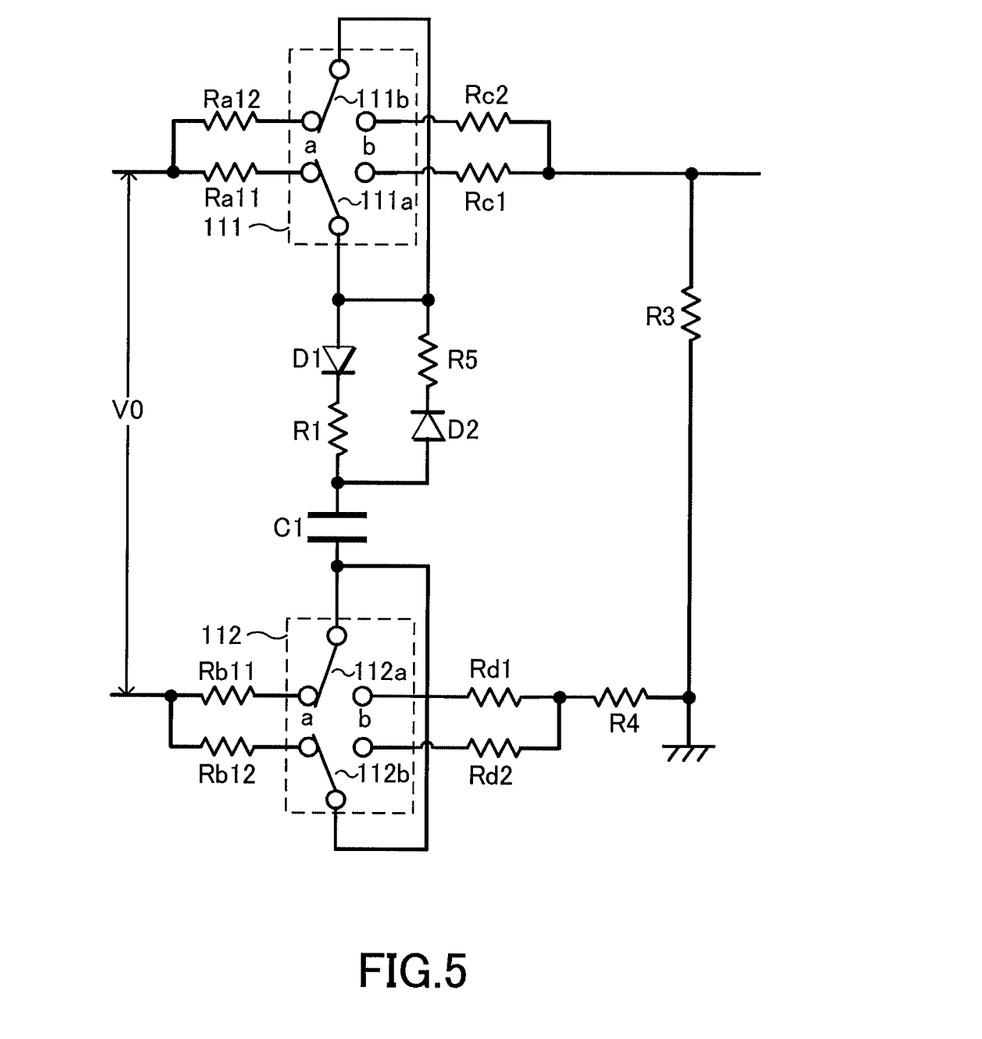
FIG. 5 is a diagram illustrating a circuit of a fourth example in which a twin relay is used for a C contact switch.

As illustrated in FIG. 5, a shunt resistor may be provided on the contact a side path and the contact b side path of each relay. In the example of this figure, a resistor Ra11 is connected to the side of the contact a of the relay 111a, a resistor Ra12 is connected to the side of the contact a of the relay 111b, a resistor Rc1 is connected to the side of the contact b of the relay 111a, and a resistor Rc2 is connected to the side of the contact b of the relay 111b. Further, the resistor Rb11 is connected to the side of the contact a of the relay 112a, a resistor Rb12 is connected to the side of the contact a of the relay 112b, a resistor Rd1 is connected to the side of the contact b of the relay 112a, and a resistor Rd2 is connected to the side of the contact b of the relay 112b.

Here, resistance Ra11=resistance Ra12=resistance Rb11=resistance Rb12>>resistance Rc1=resistance Rc2=resistance Rd1→resistance Rd2>>contact resistance of the relay.

Further, in the example of this figure, a parallel resistor of the resistor Ra11 and the resistor Ra12 plays a role of the resistor Ra, and a parallel resistor of the resistor Rb11 and the resistor Rb12 plays the role of the resistor Rb. Therefore, in the case of using the same resistance as in FIG. 1, resistance Ra11=resistance Ra12=resistance Rb11=resistance Rb12=2×the resistance Ra=2×resistance Rb.

As a result, even if one of the relays is stuck or short-circuited, the energizing current is limited by one of the resistor Ra11, the resistor Ra12, the resistor Rb11, and the resistor Rb12. Therefore, in addition to being possible to protect the control device 120, it is possible to prevent an erroneous ground fault detection due to the fact that the current flowing through the measurement path increases and insulation resistance is detected to be small.

The resistor Rc1, the resistor Rc2, the resistor Rd1, and the resistor Rd2 may be replaced by the resistors Ra21, Ra22, Rb21, and Rb22 of the third example.

Fifth Example

As described above, in the case of the second example illustrated in FIG. 3, since the shunt ratio of the twin relay connected in parallel is based on the minute contact resistances of the relays constituting the twin relay, the load may be biased to one relay, due to individual variation or the like.

Figure 6:
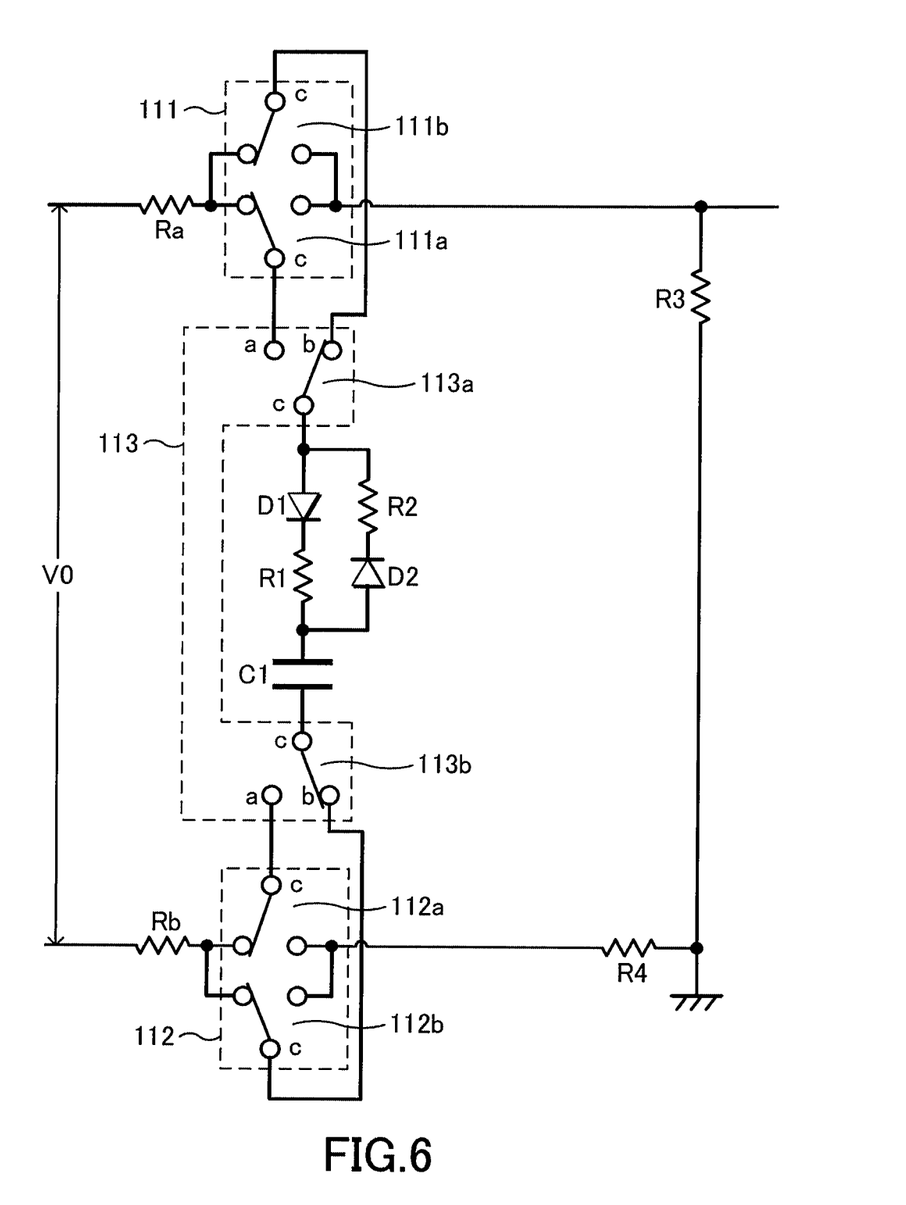
FIG. 6 is a diagram illustrating a circuit of a fifth example in which a twin relay is used for a C contact switch.

Since the number of times of opening and closing for durability of the relay is greatly increased if there is no energization, the C contact switch is further provided at the common contact c of each relay constituting the twin relay as illustrated in FIG. 6, whereby the relay that conducts the current may be exclusively selected. The selection of the relay that conducts the current is made so that energization counts of the respective relays are substantially the same, whereby it is possible to prevent the bias of the load to one relay constituting the twin relay.

In the example of this figure, a contact a of a positive-electrode-side path switching C contact switch 113a is connected to the common contact c of the relay 111a constituting the positive-electrode-side C contact switch 111, and a contact b of the positive-electrode-side path switching C contact switch 113a is connected to a common contact c of the relay 111b.

The common contact c of the positive-electrode-side path switching C contact switch 113a is disposed on the side of the detection capacitor C1. Specifically, it is connected to the detection capacitor C1 via the parallel circuit of the path of the diode D1 and the resistor R1 and the path of the resistor R2 and the diode D2.

Further, a contact a of a negative-electrode-side path switching C contact switch 113b is connected to the common contact c of the relay 112a constituting the negative-electrode-side C contact switch 112, and a contact b of the negative-electrode-side path switching C contact switch 113b is connected to the common contact c of the relay 112b. A common contact c of the negative-electrode-side path switching C contact switch 113b is connected to the other end of the detection capacitor C1.

The positive-electrode-side path switching C contact switch 113a and the negative-electrode-side path switching C contact switch 113b constitute a path switching C contact switch 113 of the twin relay.

The path switching C contact switch 113 is controlled, for example, in such a way that the control device 120 switches the current path between the contact a and the contact b equally. Alternatively, it may be switched based on other information generated at a probability of 50%. For example, the path switching C contact switch 113 may be switched in accordance with a value of lower 1 bit of an output of a sensor provided in the ground fault detection apparatus 100.

Sixth Example

In the third example illustrated in FIG. 4, a shunt resistor having the same resistance value is connected to the common contact c side path of each relay, thereby preventing the bias of the load to one relay constituting the twin relay.

Figure 7:
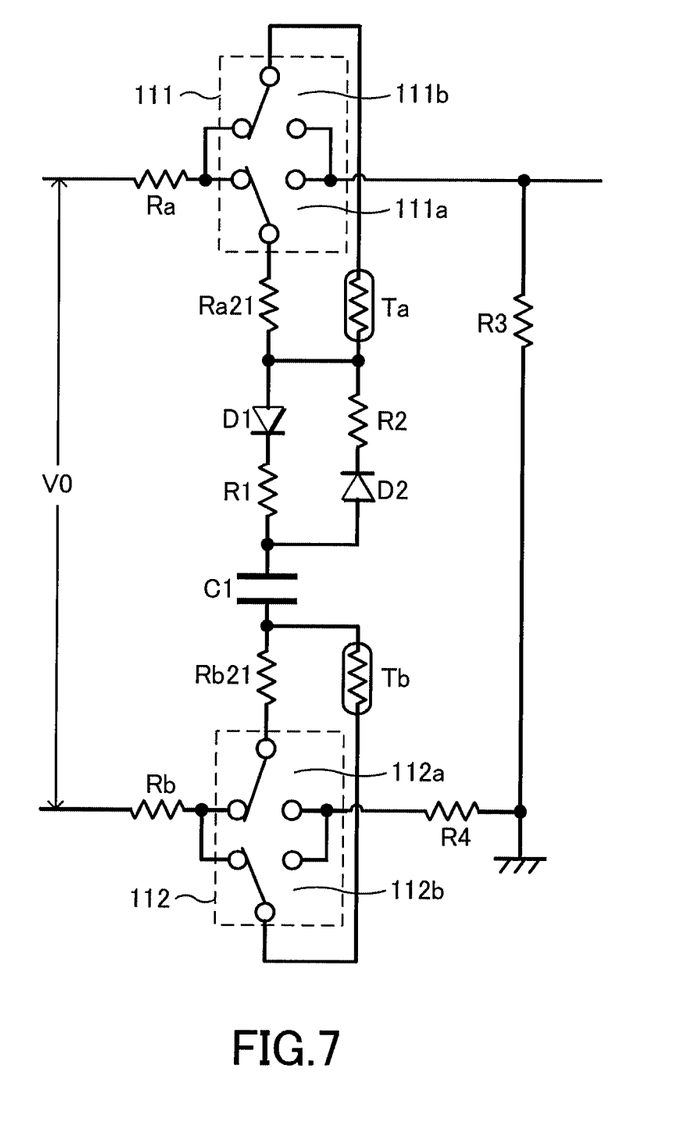
FIG. 7 is a diagram illustrating a circuit of a sixth example in which a twin relay is used for a C contact switch.

Here, as illustrated in FIG. 7, one shunt resistor of paired shunt resistors may be a thermistor. By setting a resistance value of a thermistor and the resistance values of paired ordinary resistors to be the same at a standard temperature in the ground fault detection apparatus 100, it is possible to prevent, the bias of the load to one relay constituting the twin relay.

In other words, when a thermistor whose resistance value decreases due to temperature rise is used, more current flows through the relay to which the thermistor is connected at a temperature higher than the standard temperature, and more current flows through the relay to which the ordinary resistor is connected at a temperature lower than the standard temperature. This makes it possible to equalize the currents flowing through the respective relays constituting the twin relay. Even when a thermistor whose resistance value rises due to the temperature rise is used, it is possible to equalize the currents flowing through the respective relays.

In the example of this figure, a thermistor Ta (=Ra21<<R1 at the standard temperature) is connected to the path of the relay 111b constituting the positive-electrode-side C contact switch 111, and a thermistor Tb (=Rb21<<R1 at the standard temperature) is connected to the path of the relay 112b constituting the negative-electrode-side C contact switch 112.

Figure 8:
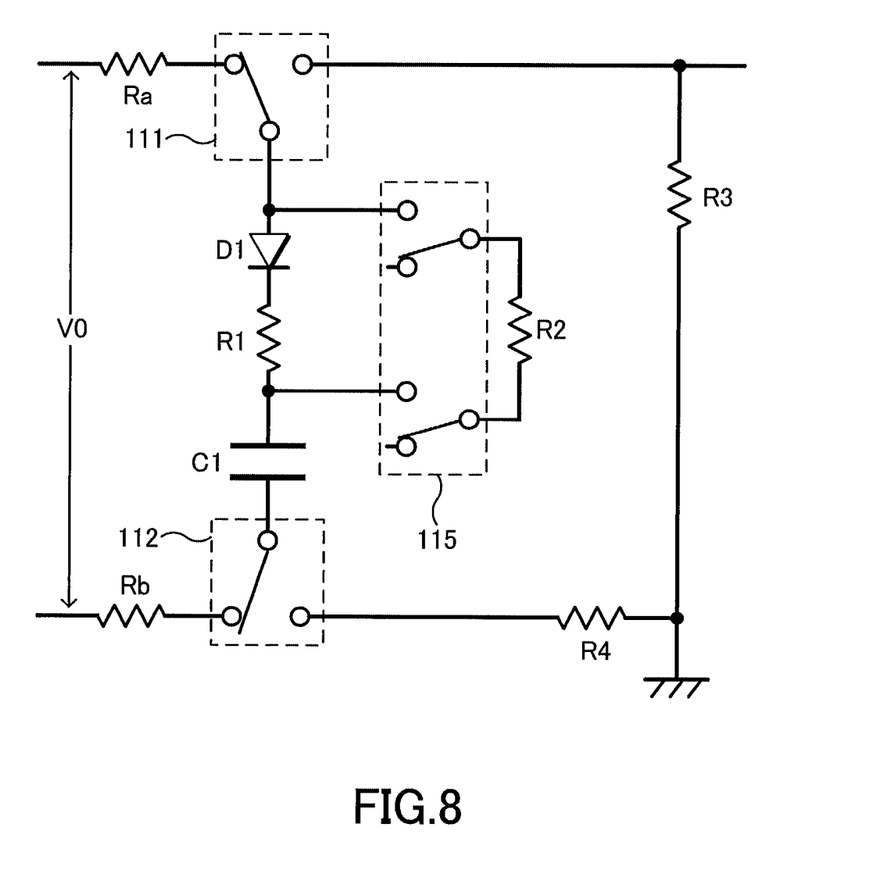
FIG. 8 is a diagram illustrating a circuit in which a C contact switch is used for a discharge path.

In any of the aforementioned examples, as illustrated in FIG. 8, a connecting state of a discharge path of the detection capacitor C1 may be switched by using a twin relay functioning as a connection switch 115. That is, the connection switch 115 is switched so that a discharge resistor R2 is connected when the detection capacitor C1 is discharged and the discharge resistor R2 is disconnected in other cases. In this case, a discharge side diode D2 connected in series with the discharge resistor R2 is unnecessary.

Since the diode D2 is unnecessary, it is possible to prevent a discharge residue corresponding to a voltage drop of the diode D2 during discharging and to completely discharge the detection capacitor C1. As a result, a detection accuracy can be improved. Further, when a polarized electrolytic capacitor is used as the detection capacitor C1, a protection diode or the like is additionally required, but according to the present configuration, a negative potential charging path from the ground to the positive electrode is not formed even in the Vc1n measurement period, whereby the electrolytic capacitor can be used without adding a protection circuit.

REFERENCE SIGNS LIST

100 GROUND FAULT DETECTION APPARATUS
111 POSITIVE-ELECTRODE-SIDE C CONTACT SWITCH
112 NEGATIVE-ELECTRODE-SIDE C CONTACT SWITCH
113 PATH SWITCHING C CONTACT SWITCH
115 CONNECTION SWITCH
120 CONTROL DEVICE
300 HIGH-VOLTAGE BATTERY
301 POSITIVE-ELECTRODE-SIDE POWER SUPPLY LINE
302 NEGATIVE-ELECTRODE-SIDE POWER SUPPLY LINE

What is claimed is:

1. A ground fault detection apparatus that is connected to a non-grounded high-voltage battery and detects a ground fault of a system provided with the high-voltage battery, the ground fault detection apparatus comprising:
a control unit;
a detection capacitor that operates as a flying capacitor;
a positive-electrode-side first resistor connected to a positive-electrode side of the high voltage battery;
a negative-electrode-side first resistor connected to a negative-electrode side of the high-voltage battery;
a positive-electrode-side second resistor having a first end grounded and a second end, a voltage of the second end being measured by the control unit;
a negative-electrode-side second resistor having a first end grounded;
a positive-electrode-side C contact switch that is formed as a twin relay having relays operating in conjunction with each other and connected in parallel, and that is configured to alternatively switch a connection destination of a first end of the detection capacitor between a path including the positive-electrode-side first resistor and a path including the positive-electrode-side second resistor based on an instruction from the control unit;
a negative-electrode-side C contact switch that is formed as a twin relay having relays operating in conjunction with each other and connected in parallel, and that is configured to alternatively switch a connection destination of a second end of the detection capacitor between a path including the negative-electrode-side first resistor and a path including the negative-electrode-side second resistor based on an instruction from the control unit; and
a path switching C contact switch formed as a twin relay having relays configured to operate in conjunction with each other, one of the relays of the path switching C contact switch being configured to switch one of the relays of the positive-electrode-side C contact switch to the connection destination of the first end of the detection capacitor, and another one of the relays of the path switching C contact switch being configured to switch one of the relays of the negative-electrode-side C contact switch to a connection destination of the second end of the detection capacitor.

* * * * *